United States Patent
Derckx et al.

(10) Patent No.: US 11,131,019 B2
(45) Date of Patent: Sep. 28, 2021

(54) APPARATUS FOR COATING SUBSTRATES

(71) Applicant: IHI HAUZER TECHNO COATING B.V., LL Venlo (NL)

(72) Inventors: Don Derckx, BZ Beegden (NL); Dave Doerwald, HP Nijmegen (NL); Ruud Jacobs, XX Venlo (NL); Marijn Gelten, TH Eindhoven (NL)

(73) Assignee: IHI Hauzer Techno Coating B.V.

( * ) Notice: Subject to any disclaimer, the term of this patent is extended or adjusted under 35 U.S.C. 154(b) by 238 days.

(21) Appl. No.: 15/661,684

(22) Filed: Jul. 27, 2017

(65) Prior Publication Data

US 2018/0037986 A1 Feb. 8, 2018

(30) Foreign Application Priority Data

Aug. 3, 2016 (EP) ..................................... 16182561

(51) Int. Cl.
*C23C 14/34* (2006.01)
*C23C 14/50* (2006.01)
(Continued)

(52) U.S. Cl.
CPC ............ *C23C 14/541* (2013.01); *C23C 14/34* (2013.01); *C23C 14/505* (2013.01);
(Continued)

(58) Field of Classification Search
CPC .... H01J 37/34; H01J 37/3405; H01J 37/3438; H01J 37/32715; H01J 37/32724;
(Continued)

(56) References Cited

U.S. PATENT DOCUMENTS 7,879,209 B2 * 2/2011 Tilsch ............... H01J 37/32541
204/298.06
2004/0074445 A1 4/2004 Fujii et al.
(Continued)

FOREIGN PATENT DOCUMENTS

CN 104911544 A 9/2015
DE 102006020004 B4 6/2011
(Continued)

OTHER PUBLICATIONS

Machine Translation JP58153779 (Year: 1983).*
Extended European Search Report for related EP Application No. 16182561.7; dated Feb. 16, 2017; 8 pages.

*Primary Examiner* — Michael A Band
(74) *Attorney, Agent, or Firm* — Dickinson Wright PLLC

(57) ABSTRACT

An apparatus for coating substrates includes a vacuum chamber having an opening through which substrates can be received and a door configured to seal the opening; one or more targets arranged in the vacuum chamber; a cooling unit configured to cool the substrates and/or a heating unit configured to heat the substrates; rotating means configured to rotate substrates relative to the one or more targets, the cooling unit and/or the heating unit; and a lifting chamber that communicates with the interior of the vacuum chamber and is configured to receive the cooling unit and the heating unit. The vacuum chamber defines a lifting axis along which the cooling unit and/or the heating unit and the lifting chamber are arranged, and the apparatus further comprises displacement means configured to displace the cooling unit and/or the heating unit along the lifting axis and between the vacuum chamber and the lifting chamber.

14 Claims, 10 Drawing Sheets

(51) Int. Cl.
*C23C 14/54* (2006.01)
*H01J 37/34* (2006.01)
*H01J 37/32* (2006.01)

(52) U.S. Cl.
CPC .. *H01J 37/32715* (2013.01); *H01J 37/32724* (2013.01); *H01J 37/32779* (2013.01); *H01J 37/34* (2013.01)

(58) Field of Classification Search
CPC ........... H01J 37/32779; H01J 37/32055; H01J 37/32559; H01J 1/42; C23C 14/34; C23C 14/505; C23C 14/541; C23C 14/3492; C23C 14/564
See application file for complete search history.

(56) References Cited

U.S. PATENT DOCUMENTS

| | | |
|---|---|---|
| 2008/0067969 A1 | 3/2008 | Fujinaka et al. |
| 2010/0078309 A1* | 4/2010 | Ueda .................... C23C 14/352 204/192.1 |
| 2010/0276283 A1* | 11/2010 | Muenz .............. H01J 37/32055 204/298.14 |
| 2016/0068946 A1 | 3/2016 | Segawa et al. |

FOREIGN PATENT DOCUMENTS

| | | | | |
|---|---|---|---|---|
| DE | 102012200564 A1 * | 7/2013 | ......... | H01J 37/3405 |
| JP | 58153779 A | 3/1982 | | |
| JP | 2006169590 | 6/2006 | | |
| WO | 2008005995 A2 | 1/2008 | | |
| WO | 2008067969 A1 | 6/2008 | | |

* cited by examiner

APPARATUS FOR COATING SUBSTRATES

The present application relates to apparatuses for coating substrates, in particular to apparatuses for physical vapor deposition.

Physical vapor deposition is a process for depositing a thin layer of vaporized source material onto one or more substrates arranged in a vacuum chamber. Known types of physical vapor deposition processes include cathodic arc deposition and magnetron or sputter deposition, high power impulse magnetron sputtering or HIPMS or plasma assisted chemical vapor deposition (PACVD).

The apparatus used for physical vapor deposition includes a vacuum chamber having an opening through which substrates can be received and a door configured to seal the opening. A removable table or support structure is configured to pass through the opening of the vacuum chamber and to support substrates within the vacuum chamber. At the start of the coating process, a vacuum pump, for example a roughing pump and/or a turbomolecular pump, is used to evacuate the vacuum chamber. Then physical processes, such as metal-ion etching, arc evapo-ration or sputtering, are used to produce a vapor of material from one or more targets arranged in the vacuum chamber. Once source material has been released from the target(s) in the form of vapor, it can be deposited onto the substrates to form a thin coating. In other types of physical processes, such as PACVD or Ar-ion etching, only gases are used as the source material.

During the coating process, the substrates absorb heat and require cooling. Like-wise, the substrates may need to be heated as part of the coating process. Since the coating process is conducted in a vacuum chamber, it is challenging to design a both reliable and simple heating and/or cooling system. For example, cooling systems that use a refrigerant may be prone to leakage. Furthermore, it has prov-en difficult to design a heating and/or cooling system that enables sufficient heat transfer to and from the substrates during the coating process but still allows the substrates to easily be loaded and unloaded before and after the coating process. Therefore, there remains a need for coating apparatus that can reliably operate at a wide range of process temperatures.

The present application provides an apparatus for coating substrates comprising a vacuum chamber having an opening through which substrates can be received and a door configured to seal the opening; one or more targets arranged in the vacuum chamber; a cooling unit configured to cool the substrates and/or a heating unit configured to heat the substrates; rotating means configured to rotate substrates relative to the one or more targets, the cooling unit and/or the heating unit; and a lifting chamber that communicates with the interior of the vacuum chamber and is configured to receive the cooling unit and the heating unit. The vacuum chamber defines a lifting axis along which the cooling unit and/or the heating unit and the lifting chamber are arranged, and the apparatus further comprises displacement means configured to displace the cooling unit and/or the heating unit along the lifting axis and between the vacuum chamber and the lifting chamber.

By configuring the cooling unit and/or the heating unit to be displaceable along the lifting axis of the vacuum chamber, the cooling unit and/or the heating unit can be placed at the center of a removable table and amongst the substrates during the coating process and lifted into the lifting chamber so that the table can easily be moved through the opening in the vacuum chamber to quickly load and unload the substrates.

In some embodiments, the displacement means are configured to displace the cooling unit and/or the heating unit along the lifting axis such that the cooling unit and the heating unit do not rotate about the lifting axis. Frequently, a cooling unit will comprise a cooling water system in which water travels in and out of the vacuum chamber via a series of tubes and/or cooling passages. Instead of water, other types of refrigerants such as oil or liquid nitrogen may also be used. When the cooling unit is configured not to rotate about the lifting axis, the design of the cooling passages can be simplified. The non-rotating cooling unit and heating unit also lend themselves to a more simple lifting mechanism.

In further embodiments, the coating apparatus further comprises a sealing assembly, for example a seal valve, configured to seal the lifting chamber from the vacuum chamber in an airtight manner. According to this aspect, the cooling unit and/or the heating unit can be lifted into the lifting chamber via the displacement means while the vacuum chamber is still placed under a vacuum. The seal valve can then be sealed to preserve the vacuum in the lifting chamber while the opening of the vacuum chamber is opened to unload the substrates and while the next set of substrates is loaded. This reduces the effort of the vacuum pump to create a re-newed vacuum in the vacuum chamber.

In other embodiments, the apparatus comprises both a cooling unit and a heating unit and the displacement means are configured to displace both the cooling unit and the heating unit. It is also possible for the displacement means to be configured to displace one of the cooling unit and the heating unit independently from the other. The latter makes it possible to lift whichever of the cooling unit and the heating unit is not in use, which reduces unnecessary exposure of said heating or cooling unit to the vaporized source material. As a consequence of the reduced exposure, less source material is deposited on the heating and the cooling unit, which reduces the need for maintenance to remove the accumulated film.

In a further aspect, the cooling unit defines a hollow body configured to enclose the heating unit, resulting in a compact design. The cooling unit may also comprise at least one cooling passage through which a refrigerant is configured to pass. For example, the cooling unit may include a water-cooled drum. Alternatively, the cooling unit may comprise a telescoping mechanism in which cooling passages, for example two half-length tubes, can be lowered into the vacuum chamber while an upper part of the telescoping mechanism remains in the lifting chamber. Additionally, the heating unit may be formed by passing a heating liquid through the at least one cooling passage.

In some embodiments, the apparatus comprises one or more auxiliary heating elements arranged at the interior wall of the vacuum chamber. Additionally or alternatively, the apparatus may comprise one or more auxiliary cooling elements, in particular cooling panels, arranged at the interior wall of the vacuum chamber. This aspect utilizes available wall space to efficiently cool and/or heat the substrates, which reduces the load on the cooling unit and/or heating unit arranged along the lifting axis of the vacuum chamber.

In a further embodiment, the apparatus comprises a temperature sensor configured to detect the temperature of the substrates and connected to a temperature control module configured to control the operation of at least one of the heating unit and the cooling unit to enable automatic control of the heating and cooling units.

According to a further aspect, the displacement means includes one or more linear actuators, for example pneumatic cylinders, arranged in parallel to the lifting axis of the vacuum chamber. For example, such linear actuators can be arranged within the lifting chamber to automatically lift the cooling unit and heating unit into the lifting chamber without occupying a large amount of space. Alternatively, it is possible to arrange the linear actuator outside of both the lifting chamber and the vacuum chamber and connect the linear actuator to the cooling unit and/or the heating unit via connecting members.

It is also possible for the displacement means to comprise one or more rails arranged in parallel to the lifting axis of the vacuum chamber and one or more guiding elements, for example wheels, bearings or sliding elements, that cooperate with the rails. For example, gear wheels that are driven by a motor may be arranged at a stationary location in the lifting chamber and cooperate with respective toothed racks that are secured to the heating unit and the cooling unit. When the motor causes the gear wheels to turn, the heating unit and the cooling unit are moved between the vacuum chamber and the lifting chamber. This arrangement makes it possible to slide the cooling unit and the heating unit into the lifting chamber using mechanically simple and easily available components. Alternatively, the displacement means may comprise a pulley and a steel wire, which utilizes gravity to lower the cooling unit and/or the heating unit into the vacuum chamber. This arrangement also includes a motor or drive for rotating the pulley to lift the cooling unit and/or the heating unit via the steel wire into the lifting chamber.

According to a further embodiment, the rotating means include a planetary gear arrangement in which the individual substrates are each supported on a rod, such that the individual substrates can rotate both with respect to the lifting axis of the vacuum chamber and about the rod. Such a planetary gear arrangement results in even exposure of the substrates to both the one or more targets along the interior wall of the vacuum chamber and the centrally arranged cooling and heating units, which results in efficient heat transfer and improved deposition.

Further features and advantages of the present invention will become apparent from the following detailed description, the accompanying drawings, and the appended claims.

Figure 1:
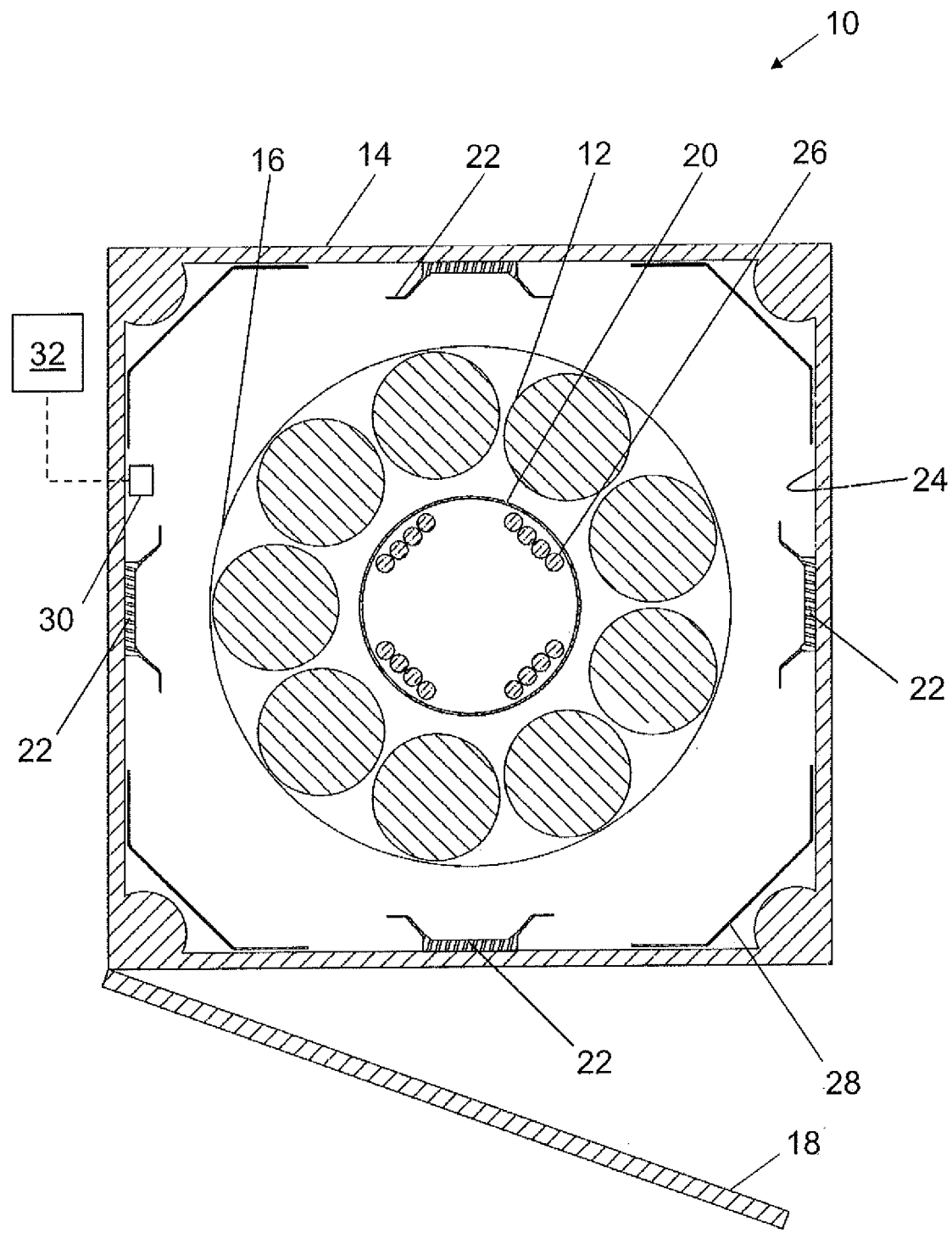
FIG. 1 shows a horizontal cross-section through a vacuum chamber in which a plurality of substrates is arranged about a heating unit and a cooling unit.
Figure 4A:
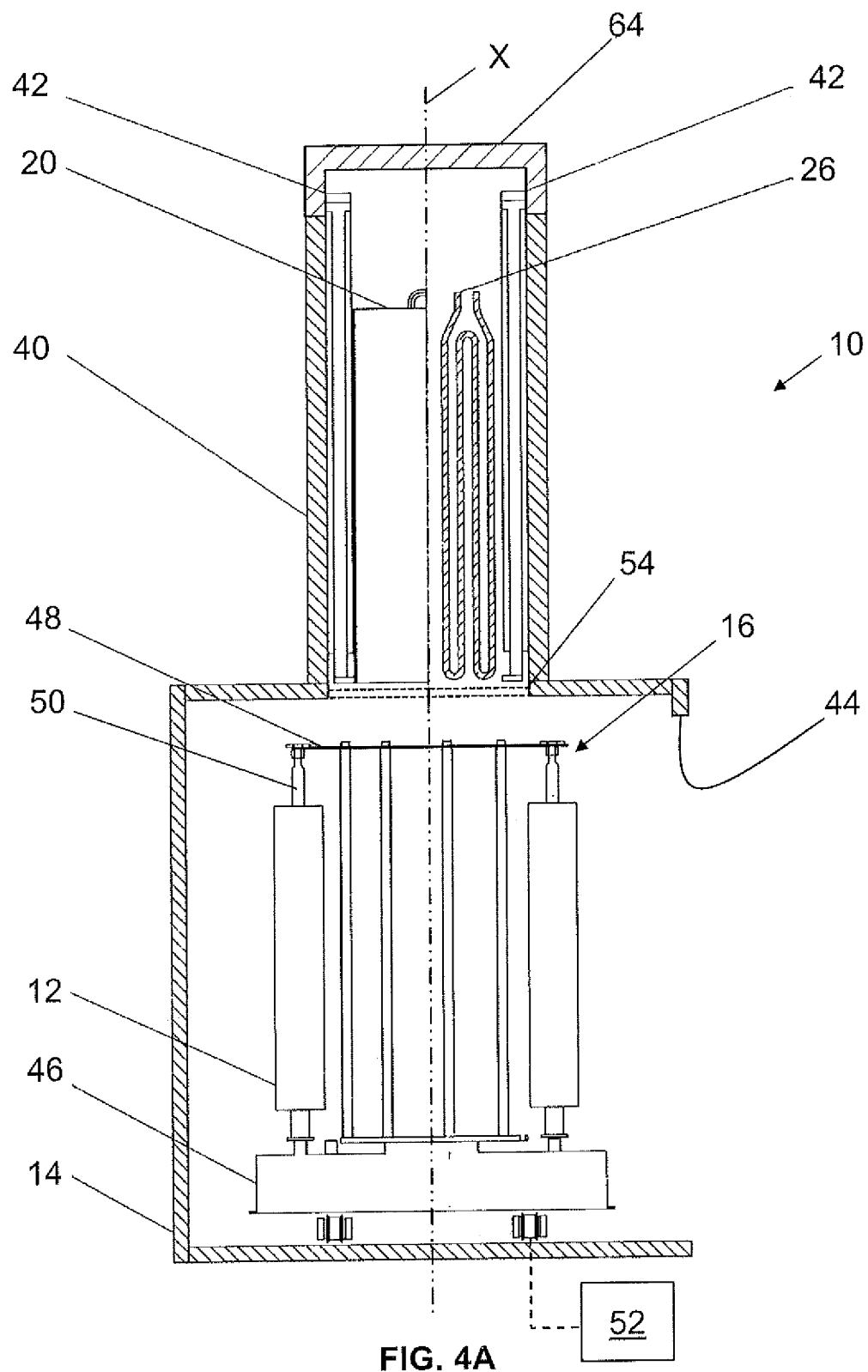
Figure 4B:
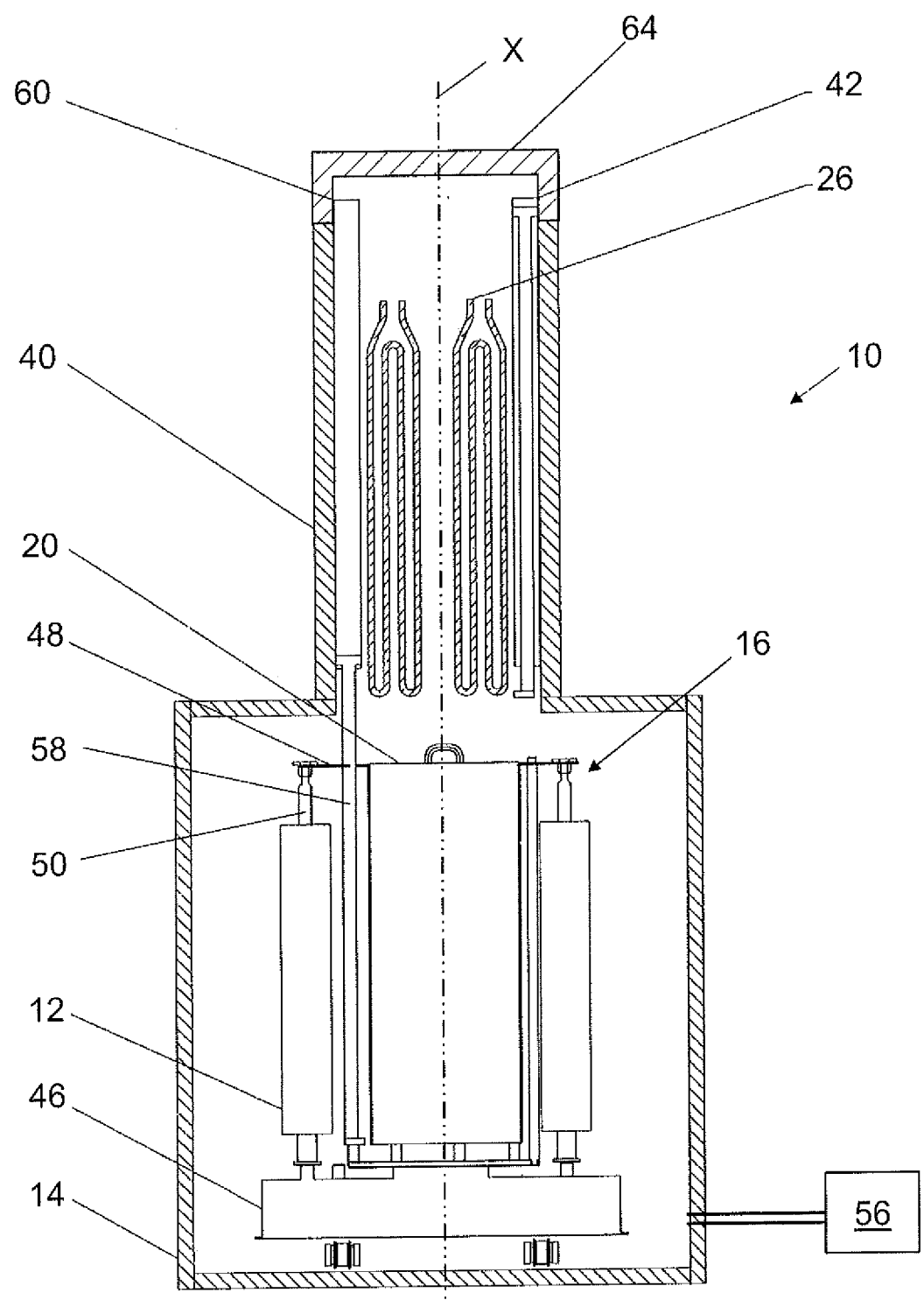
Figure 4C:
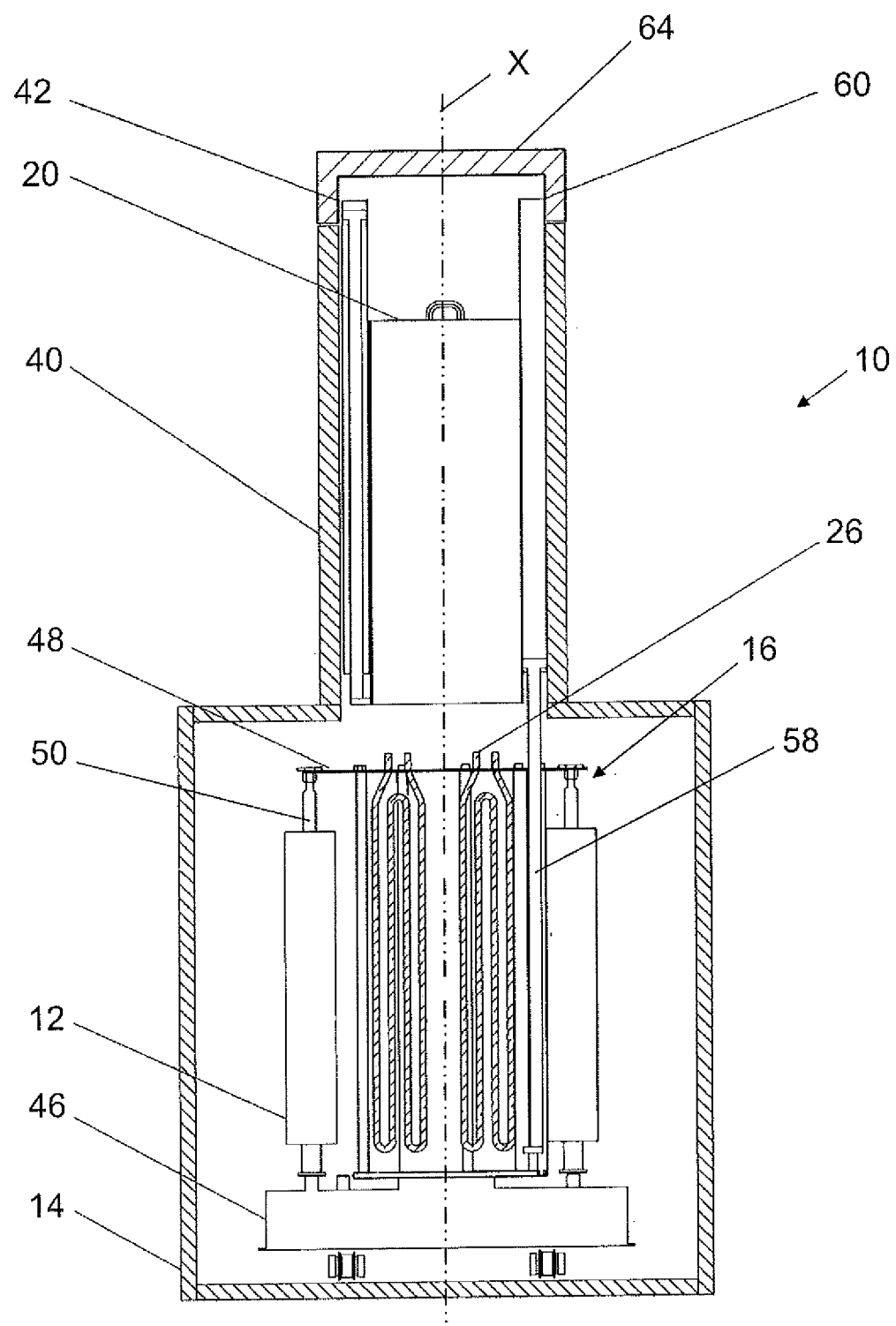

FIGS. 4A to 4C schematically illustrate an embodiment with pneumatic displacement means for lifting the heating unit and cooling unit of FIG. 1.

Figure 5:
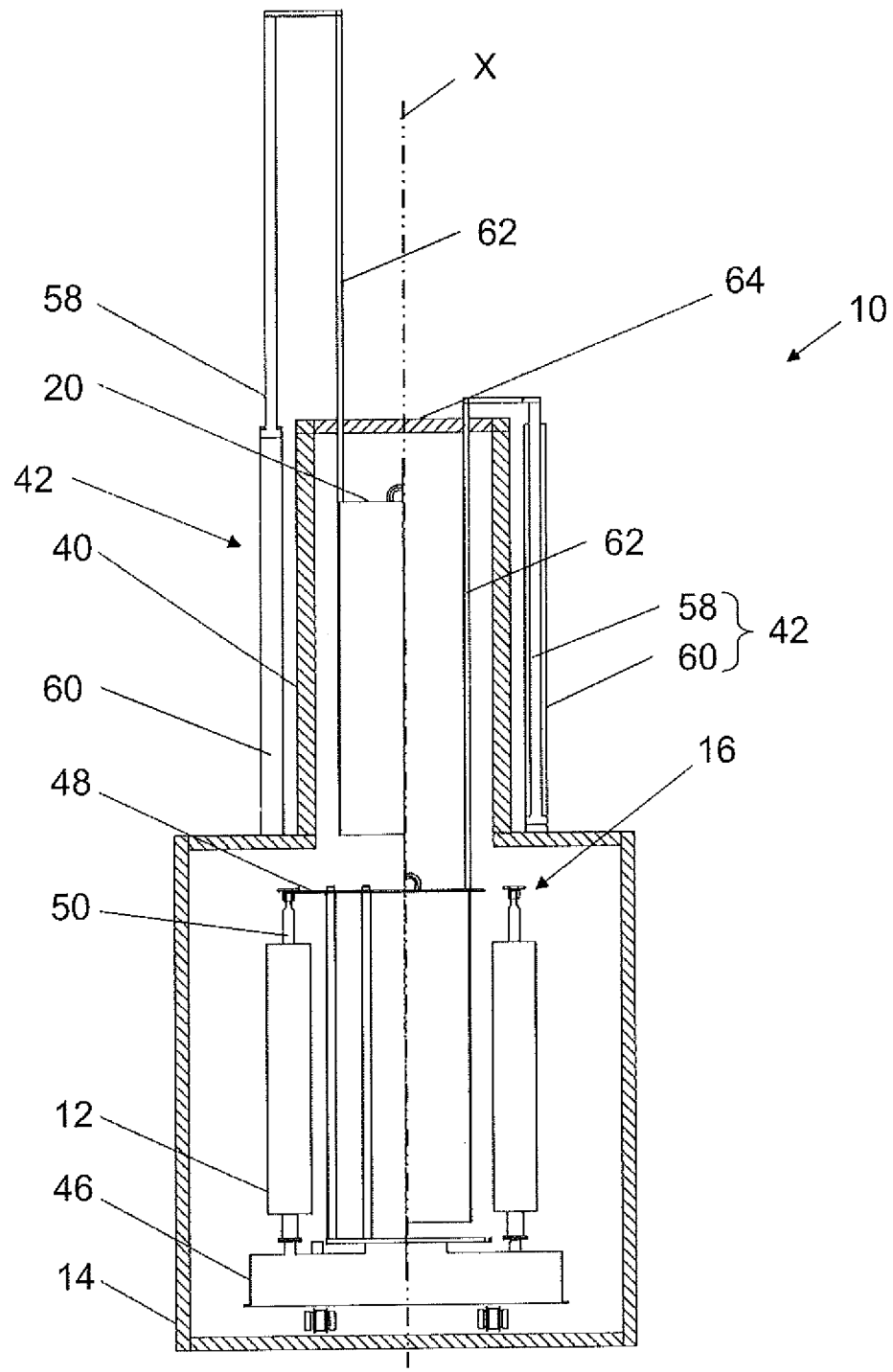

FIG. 5 shows an alternative to FIG. 4 in which the displacement means are arranged outside of the lifting chamber and the vacuum chamber.

Figure 6A:
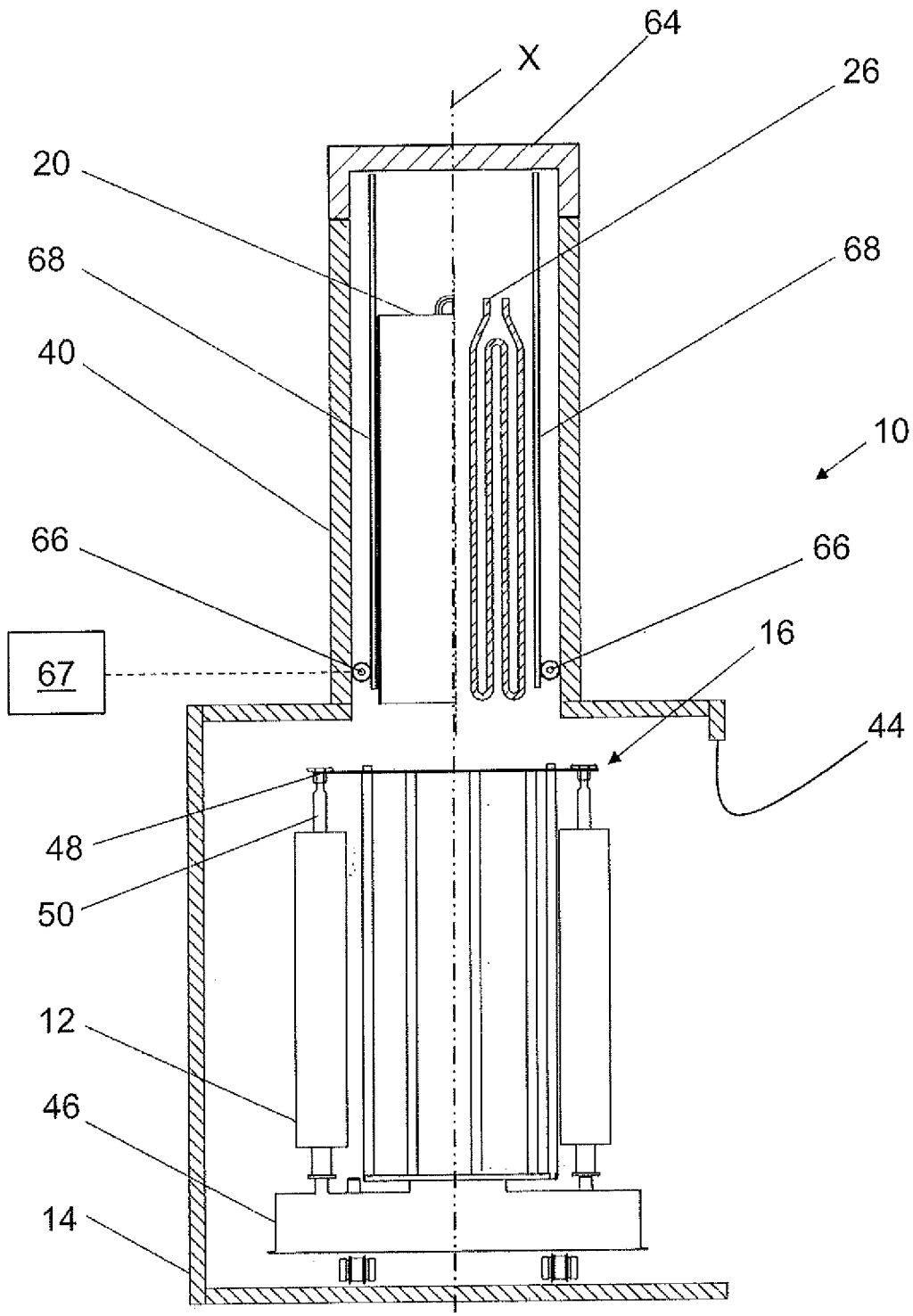
Figure 6B:
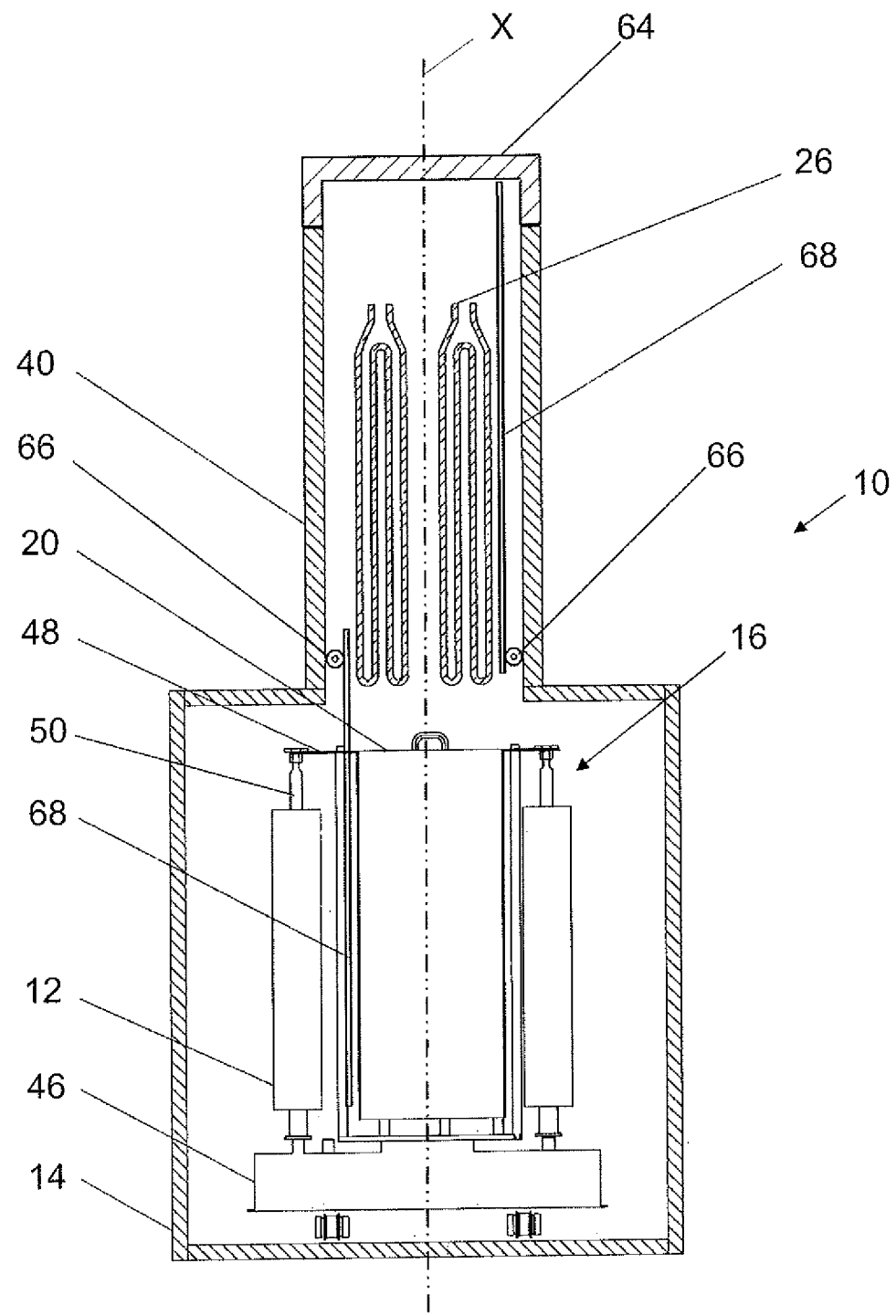
Figure 6C:
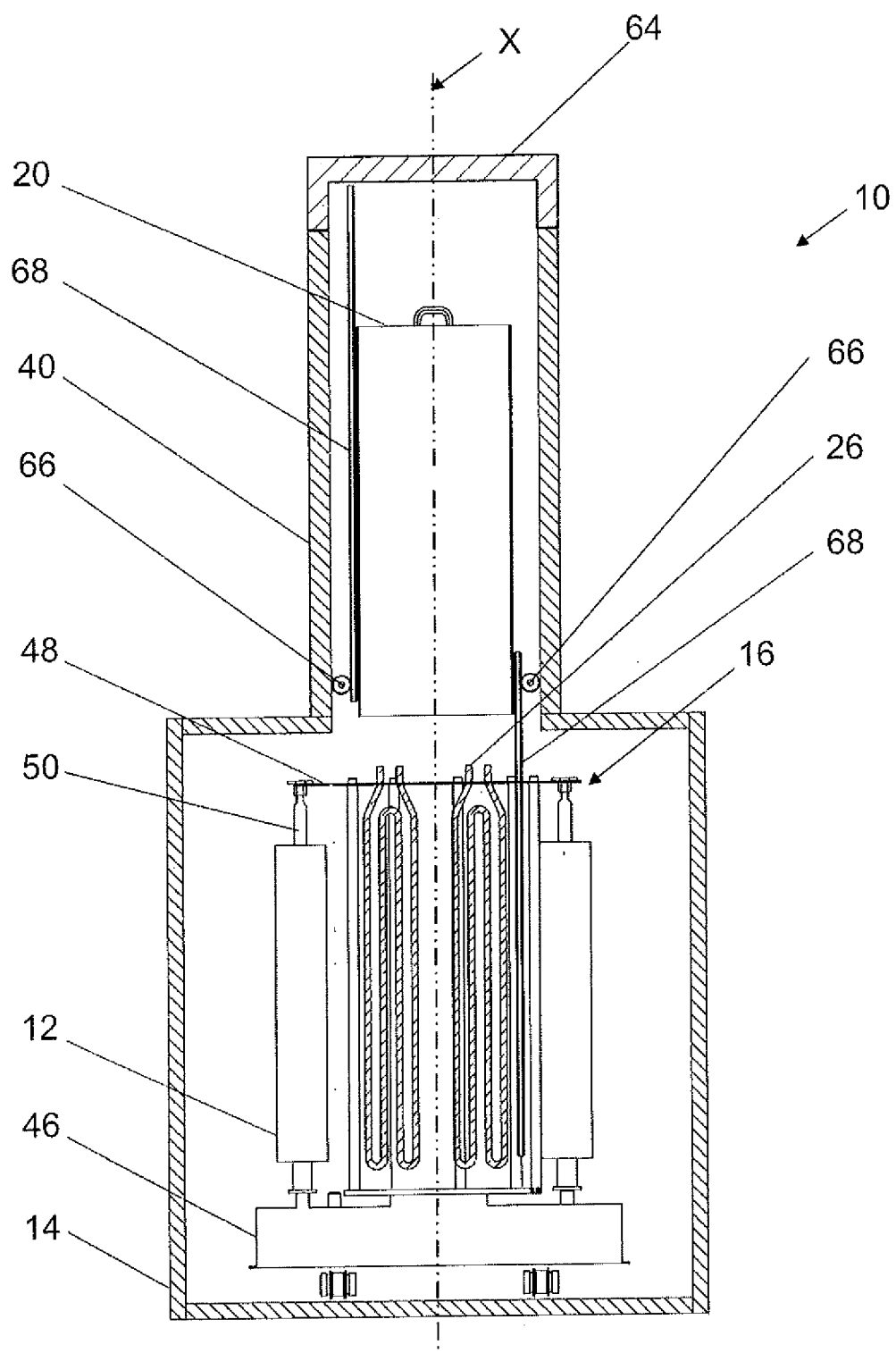

FIGS. 6A to 6C schematically illustrate an embodiment with mechanical displacement means for lifting the heating unit and cooling unit of FIG. 1.

FIG. 1 shows a horizontal cross-section through an apparatus 10 for coating a plurality of substrates 12. In the figures, the substrates 12 are illustrated schematically as having a simple cylindrical shape, but the substrates 12 may also have a complex outer geometry. The substrates 12 are arranged within a vacuum chamber 14 and are supported on a removable table 16 (see FIG. 4A). The vacuum chamber 14 comprises a plurality of targets 22 arranged at an interior wall 24 of the vacuum chamber 14. FIG. 1 specifically shows a door 18 through which the inside of the vacuum chamber 14 is accessible. While the door 18 is not shown in the other figures, it is understood that the vacuum chambers 14 in the other figures also comprise such a door 18.

The apparatus 10 further comprises a cooling unit consisting of a cooling drum 20, for example a water-cooled drum. The cooling drum 20 is arranged at the table 16, and the substrates 12 are arranged around the outer surface of the cooling drum 20. The table 16 includes a rotating means configured to rotate each of the substrates 12 about a rod 50 (see FIG. 4A) and relative to the cooling drum 20.

In the embodiment of FIG. 1, the cooling drum 20 forms a hollow body that encloses a plurality of heating elements 26 that form a heating unit of the apparatus 10. The heating elements 26, shown here schematically, can be either resistive tubu-lar heating elements, infrared heaters or heating elements in which a special oil or other medium is passed through heating tubes.

As shown in FIGS. 4C and 6C, the cooling drum 20 can be lifted to expose the substrates 12 to the heating elements 26. Since the heating elements 26 are also arranged at the center of the table 16, the rotating means of the table 16 are also able to rotate the substrates 12 relative to the heating elements 26 for homoge-nous and efficient heating of the substrates 12. Though FIG. 1 shows an apparatus 10 that includes both a cooling drum 20 and heating elements 26, it is also possible to have an apparatus 10 (not shown) with either a cooling drum 20 or the heating elements 26, but not the other.

In addition to the cooling drum 20 and the heating elements 26 arranged at the center of the table 16, the embodiment of FIG. 1 also includes a plurality of auxiliary heating or cooling panels 28 that are arranged at corners of the interior wall 24 of the vacuum chamber 14.

Furthermore, the apparatus 10 comprises a temperature sensor 30 that is configured to detect the temperature of the substrates 12 and is connected to a temperature control module 32 configured to control the operation of the cooling drum 20, the heating elements 26 and/or the auxiliary heating or cooling panels 28. Though FIG. 1 shows the temperature sensor 30 arranged at the interior wall 24 of the vacuum chamber 14, the specific location of the temperature sensor 30 within the apparatus 10 may vary. For example, the sensor 30 may be placed on the table 16. Alternatively, the sensor 30 may be arranged at the cooling drum 20 and/or at the heating elements 26 so that the substrates 12 also rotate about the sensor 30 and the sensor 30 can be lifted together with the cooling drum 20 and/or at the heating elements 26.

Figure 2:
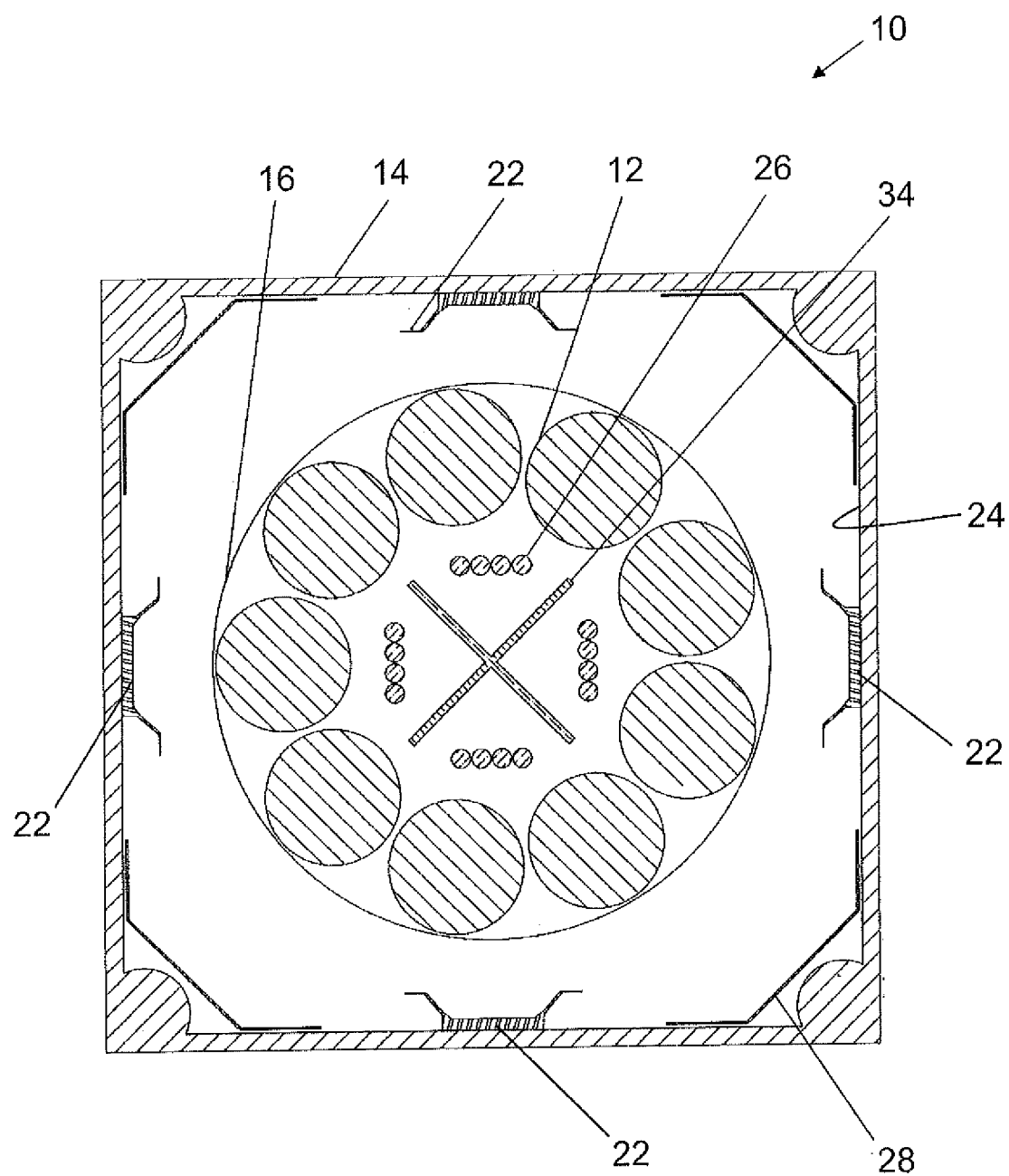
FIG. 2 shows a horizontal cross-section similar to FIG. 1 in which the apparatus has an alternative configuration of the heating and cooling units.

FIG. 2 shows another embodiment of an apparatus 10 having the same components as the apparatus 10 of FIG. 1 apart from the cooling drum 20. In the place of the cooling drum 20 in the apparatus 10 of FIG. 1, FIG. 2 shows a cross-shaped cooling panel 34 arranged between the four heating elements 26. Though the heating panel 34 is cross-shaped to enable an overall compact design of the heating unit and cooling unit, it is understood that the specific number of heating elements 26 and/or the cross-sectional shape of such a cooling panel 34 may vary.

Figure 3:
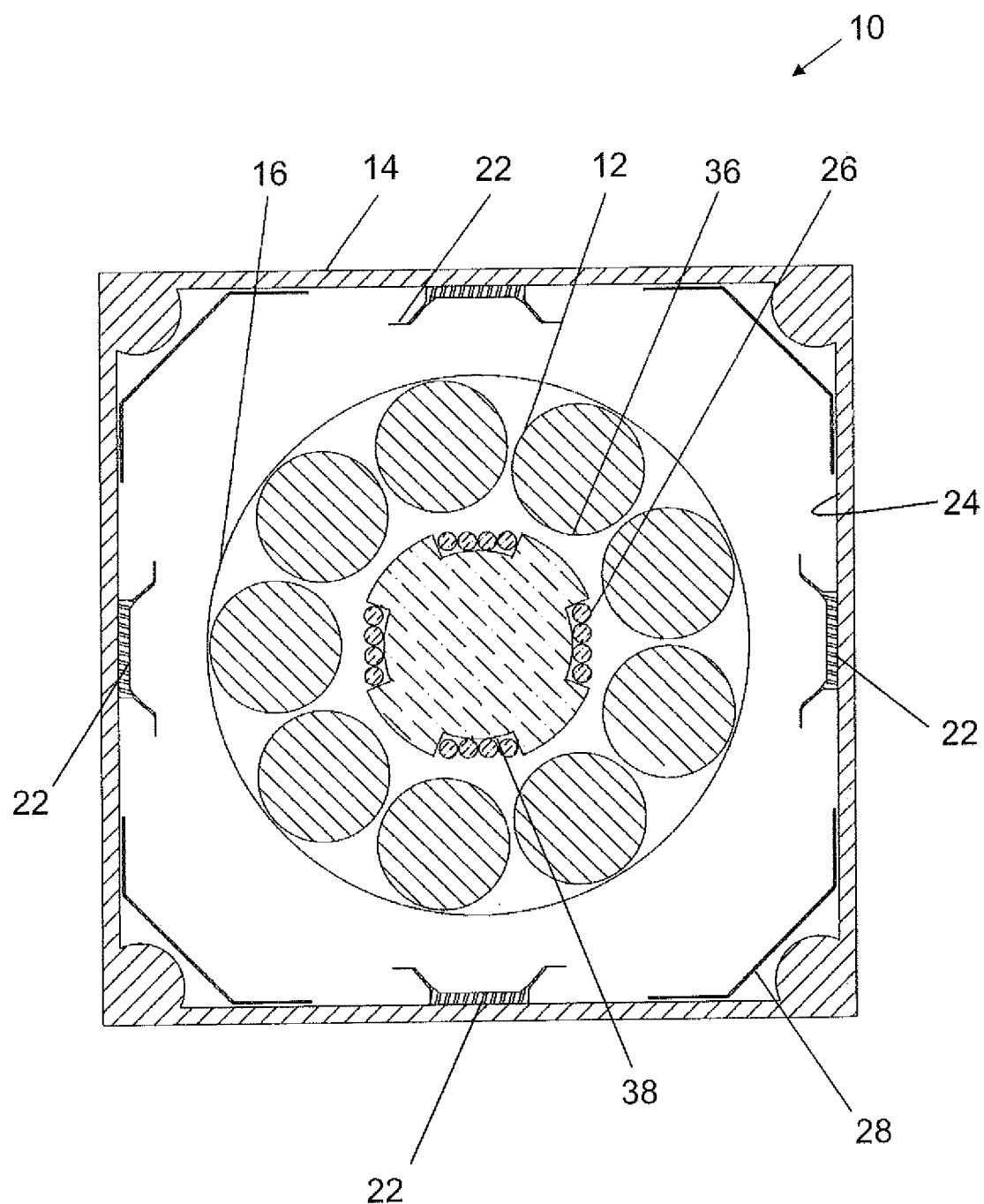
FIG. 3 shows a horizontal cross-section similar to FIGS. 1 and 2 in which the apparatus has a further configuration of the heating and cooling units.

FIG. 3 shows a further alternative to the cooling drum 20 of FIG. 1 and the cooling panels 34 of FIG. 2. Specifically, the cooling unit in the embodiment of FIG. 3 is a cooling drum 36 whose outer surface includes a plurality of recesses 38 for receiving the heating elements 26. Alternatively, the cooling drum 36 may be circular in cross section, i.e. not have any recesses 38. In this case, the heating elements 26 may simply be arranged in intervals about the outer surface of the cooling drum 36.

FIGS. 4A to 4C show a vertical cross section through the apparatus 10 of FIG. 1, in particular a lifting chamber 40 that communicates with the interior of the vacuum chamber 14 and is configured to receive the cooling drum 20 and the heating elements 26. Specifically, the vacuum chamber 14 defines a lifting axis, in this case a centrally arranged central axis X, and the cooling drum 20, the heating elements 26 and the lifting chamber 40 are all coaxially aligned along the central axis X of the vacuum chamber 14. FIGS. 4 to 6 show a design in which the vacuum chamber 14 and the lifting chamber 40 are recognizable as distinct, interconnected sections of the apparatus 10. However, it is also possible for the lifting chamber 40 to be part of, i.e. formed within, the vacuum chamber 14. In this alternative, it is not nec-essary for there to be a distinct border or separation between the vacuum chamber 14 and the lifting chamber 40.

The apparatus 10 further comprises displacement means in the form of linear actuators 42 that each include a rod 58 arranged within a cylinder 60, for example pneumatic linear actuators. The linear actuators 42 are arranged inside of the lifting chamber 40 and in parallel to the central axis X and are respectively configured to move the cooling drum 20 and the heating elements 26 between the vacuum chamber 14 and the lifting chamber 40.

FIG. 4A shows the apparatus 10 in a state of loading or unloading in which both the cooling drum 20 and the heating elements 26 have been lifted out of the vacuum chamber 14 and into the lifting chamber 40. In this state, the table 16 can be quickly and easily moved out of an opening 44 to the vacuum chamber 14 which is otherwise sealed off by the door 18 (see FIG. 1).

FIG. 4A also schematically illustrates where a sealing assembly 54 that is configured to seal the lifting chamber 40 from the vacuum chamber 14 in an airtight manner, for example by means of a vacuum valve, may be located. When the cooling drum 20 and the heating elements 26 are in the lifted state, the sealing assembly 54 may be closed so that the heating elements 26 and/or the cooling drum 20 are enclosed by the walls of the lifting chamber 40, a lid portion 64 of the lifting chamber 40 and the sealing assembly 54 to preserve the vacuum inside of the lifting chamber 40.

With the cooling drum 20 and the heating elements 26 arranged in the lifting chamber 40, it is possible to more clearly see the support structure comprised by the table 16 for supporting the substrates 12 in the vacuum chamber 14. Specifically, the table 16 includes a wheeled base 46 for rolling the table 16 through the opening 44 of the vacuum chamber 14. An upper rack 48 is arranged above the wheeled base 46 and a plurality of rods 50 are supported between the upper rack 48 and the base 46. Each of the substrates 12 is supported by an individual rod 50 so that the substrate 12 may rotate about the rod 50. A motor 52, shown schemati-cally, is connected to and drives the table 16 so that the substrates 12 rotate sim-ultaneously about the rods 50 and about the central axis X in a planetary arrangement.

Once the table 16 and the substrates 12 has been loaded into the vacuum chamber 14, the door 18 can be closed, as in FIG. 4B, and the vacuum chamber 14 can be evacuated via a pump 56. Once the vacuum chamber 14 has been placed under a vacuum, the coating process may begin. During the coating process, either the cooling drum 20 (FIG. 4B) or the heating elements 26 (FIG. 4C) may be lowered into the vacuum chamber 14 so that they are arranged at the center of the table 16.

As shown in FIGS. 4B and 4C, whichever of the cooling drum 20 or the heating elements 26 that are not in use during the process step may remain in the lifting chamber 40 to reduce exposure to the vaporized source material of the coating process. This prevents the cooling drum 20 and the heating elements 26 from becoming coated in source mate-rial as quickly as in conventional coating apparatuses, which reduces the frequency of maintenance of the apparatus 10. The heating elements 26 and the cooling drum 20 may be further shielded from unintended source material by closing the sealing assembly 54 when the heating elements 26 or the cooling drum 20 is retracted into the lifting chamber 40.

In the embodiment shown in FIGS. 4B and 4C, the cooling drum 20 and the heating elements 26 are each connected to the piston rod 58 of the linear actuators 42, while the cylinder 60 of the linear actuator 42 is fixed to an interior wall of the lifting chamber 40. In place of the linear actuators 42, it is also possible to use a linear electric motor or any other alternative linear actuator as a displacement means for the cooling drum 20 and the heating elements 26.

FIG. 5 shows an apparatus 10 that is substantially the same as the apparatus 10 shown in FIG. 4. However, in FIG. 5, the cylinder 60 of the linear actuator 42 is arranged outside of both the vacuum chamber 14 and the lifting chamber 40. The piston 58 of the linear actuator 42 is connected to the cooling drum 20, and to the heating elements 26 (not shown), via a connecting member 62 that extends through a sealed aperture provided in the lid portion 64 of the lifting chamber 40. By arranging the linear actuator 42 outside of the lifting chamber 40 and the vacuum chamber 14, the linear actuator 42 is not subjected to a vacuum. This makes it possible to easily and reliably use hydraulic linear actuators, which otherwise present a risk of leaking hydraulic fluid when they are subjected to very low pres-sures.

FIGS. 6A to 6C show an apparatus 10 that substantially corresponds to the apparatus 10 of FIGS. 4A to 4C apart from the displacement means. In the embodiment of FIGS. 6A to 6C, gear wheels 66 are fixed to the interior wall of the lifting chamber 40 and cooperate with toothed racks 68 that are attached to the cooling drum 20 and the heating elements 26 respectively. The gear wheels 66 are driven by a motor 67 (shown schematically only in FIG. 6A), and when the motor 67 causes the gear wheels to turn, the racks 68 move downwards or upwards to move the cooling drum 20 and the heating elements 26 between the vacuum chamber 14 and the lifting chamber 40.

REFERENCE NUMERALS 10 apparatus
12 substrates
14 vacuum chamber
16 table
18 door
20 cooling drum
22 targets
24 interior wall of the vacuum chamber
26 heating elements
28 heating or cooling panels
30 temperature sensor
32 temperature control module
34 cooling panel
36 cooling drum
38 recesses
40 lifting chamber
42 linear actuator 44 opening
46 base
48 upper rack
50 rods
52 motor
54 shutter assembly
56 vacuum pump
58 piston
60 cylinder
62 connecting member
64 lid portion
66 gear wheels
67 motor
68 toothed rack
X central axis

The invention claimed is:

1. An apparatus for coating substrates, the apparatus comprising:
   a vacuum chamber having an opening configured to receive substrates for coating and a door configured to seal the opening;
   one or more targets arranged in the vacuum chamber;
   a cooling unit arranged adjacently to, and configured to, cool the substrates and a heating unit configured to heat the substrates;
   a removable table configured to rotate the substrates relative to the one or more targets and along a path that encircles the cooling unit and the heating unit; and
   a lifting chamber that communicates with the vacuum chamber and is configured to receive the cooling unit and the heating unit;
   wherein the vacuum chamber defines a lifting axis along which the cooling unit and the heating unit as well as the lifting chamber are arranged;
   wherein the apparatus further comprises a displacement device configured to displace both the cooling unit and the heating unit from a center of the removable table, along the lifting axis, and between the vacuum chamber and the lifting chamber; and
   wherein the displacement device is further configured to displace the cooling unit and the heating unit independently from each other between the vacuum chamber and the lifting chamber.

2. The apparatus in accordance with claim 1 wherein the displacement device are configured to displace the cooling unit along the lifting axis such that the cooling unit does not rotate about the lifting axis.

3. The apparatus in accordance with claim 2 wherein the cooling unit defines a hollow body configured to enclose the heating unit.

4. The apparatus in accordance with claim 1 wherein the cooling unit comprises at least one cooling passage through which a refrigerant is configured to pass.

5. The apparatus in accordance with claim 4 wherein a heating unit is formed by passing a heating liquid through the at least one cooling passage.

6. The apparatus in accordance with claim 4 wherein the cooling unit includes a water-cooled drum.

7. The apparatus in accordance with claim 1 further comprising at least one of one or more auxiliary heating elements arranged at an interior wall of the vacuum chamber and one or more auxiliary cooling elements arranged at the interior wall of the vacuum chamber.

8. The apparatus in accordance with claim 7 wherein the one or more auxiliary cooling elements are formed by cooling panels arranged at the interior wall of the vacuum chamber.

9. The apparatus in accordance with claim 1 further comprising a temperature sensor configured to detect the temperature of the substrates and connected to a temperature control module configured to control the cooling unit.

10. The apparatus in accordance with claim 1 wherein the displacement device include one or more linear actuators arranged in parallel to the lifting axis of the vacuum chamber.

11. The apparatus in accordance with claim 1 wherein the displacement device include one or more rails arranged in parallel to the lifting axis of the vacuum chamber, with the one or more rails being connected to the cooling unit and one or more guiding elements arranged in the lifting chamber, wherein the guiding elements are configured to cooperate with the rails and driven by a motor.

12. The apparatus in accordance with claim 1 wherein the displacement device is arranged inside of at least one of the lifting chamber and the vacuum chamber.

13. The apparatus in accordance with claim 1 further comprising one or more connecting members that are configured to connect the cooling unit to the displacement device, with the displacement device being arranged outside the vacuum chamber and the lifting chamber.

14. The apparatus in accordance with claim 1 wherein the removable table includes a planetary gear arrangement in which the substrates are each supported on a rod, and the substrates are configured to rotate about the lifting axis of the vacuum chamber and about the rod.

* * * * *